(12) United States Patent
Ge et al.

(10) Patent No.: US 11,527,274 B1
(45) Date of Patent: Dec. 13, 2022

(54) MEMORY ARRAY CIRCUITS INCLUDING WORD LINE CIRCUITS FOR IMPROVED WORD LINE SIGNAL TIMING AND RELATED METHODS

(71) Applicant: Microsoft Technology Licensing, LLC, Redmond, WA (US)

(72) Inventors: Shaoping Ge, Cary, NC (US); Chiaming Chai, Gary, NC (US); Jason Philip Martzloff, Chapel Hill, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/332,629

(22) Filed: May 27, 2021

(51) Int. Cl.
| | |
|---|---|
| G11C 8/08 | (2006.01) |
| G11C 8/18 | (2006.01) |
| G11C 5/14 | (2006.01) |
| G11C 7/10 | (2006.01) |
| G11C 7/22 | (2006.01) |

(52) U.S. Cl.
CPC ............ *G11C 8/08* (2013.01); *G11C 5/14* (2013.01); *G11C 7/106* (2013.01); *G11C 7/1087* (2013.01); *G11C 7/222* (2013.01); *G11C 8/18* (2013.01)

(58) Field of Classification Search
CPC .................................................. G11C 8/08
USPC ........................................... 365/233.1
See application file for complete search history.

(56) References Cited

U.S. PATENT DOCUMENTS

| | | | |
|---|---|---|---|
| 6,172,935 B1 | 1/2001 | Wright et al. | |
| 10,937,477 B1* | 3/2021 | Yang | G11C 7/106 |
| 2013/0082736 A1* | 4/2013 | Dono | G11C 8/08 326/63 |
| 2013/0182514 A1* | 7/2013 | Ge | G11C 7/22 365/189.11 |
| 2017/0358344 A1 | 12/2017 | Ishii et al. | |

FOREIGN PATENT DOCUMENTS

EP 2672486 A2 12/2013

OTHER PUBLICATIONS

"International Search Report and Written Opinion Issued in PCT Application No. PCT/US22/027186", dated Jul. 18, 2022, 11 Pages.

* cited by examiner

*Primary Examiner* — Muna A Techane
(74) *Attorney, Agent, or Firm* — Withrow & Terranova, P.L.L.C.

(57) ABSTRACT

Memory array circuits including word line circuits providing word line signal stability are disclosed. In a memory access operation, the states of word line signals on word lines in the memory rows of the memory array may be based on the states of word line latches during a first clock state of a latch clock signal. The word line latches receive address decode signals generated from a decoded memory address. An inverted delay clock circuit generates a clock pulse from the latch clock signal. The word line latches store the address decode signals during the clock pulse and generate word line signals based on the stored address decode signals. The memory address is received from an address bus. Pass-through address capture latches maximize time available to a decoder for decoding the memory address and word line latches reduce fluctuations in the address signal being propagated to the word line signals.

20 Claims, 7 Drawing Sheets

MEMORY ARRAY CIRCUITS INCLUDING WORD LINE CIRCUITS FOR IMPROVED WORD LINE SIGNAL TIMING AND RELATED METHODS

FIELD OF THE DISCLOSURE

The technology of the disclosure relates to memory array circuits for storing digital data, and more particularly to memory array circuits configured to improve timing margins and avoid word line fluctuation.

BACKGROUND

Memory arrays are used in electronic devices to store large amounts of digital data for quick access by a processing device. Memory arrays are typically two-dimensional (2D) arrays of memory bit cell circuits ("memory bit cells") organized in memory rows and memory columns. The memory array is configured to have digital data bits written into and read from the memory bit cells in a memory row. A memory row of memory bit cells in a memory array can store a data word, which may be 64, 128, or 256 bits of data, for example, and may include additional bits for error detection and correction. In a memory read operation, a processing circuit sends the memory array an address of the data to be read and also provides an indication of a read operation. Some bits of the address are used to determine which memory row is to be read. Those address bits may be provided to a decoding circuit within the memory array. The memory array includes word lines corresponding to each memory row and bit lines corresponding to each memory column. The read operation includes activating the word line coupled to every memory bit cell in the memory row. The decoding circuit activates the word line corresponding to the memory row that contains the data word to be read. Each memory bit cell is also coupled to a bit line of a corresponding memory column. In response to the word line of a memory row being activated, stored data bits of the data word from the memory row are generated on the bit lines of the memory columns. The data bits generated on the bit lines are provided to an output of the memory array and sent back to the processing circuit and/or another circuit. Any variations in the word line signal that activates a word line during a read operation may cause incorrect data to be returned in a read operation.

Operations of the processing circuit and memory array circuit are synchronized by a periodic system clock signal. The system clock signal is typically in a first clock state for a portion of a clock period and in a second clock state for the remainder of the clock period based on a clock duty cycle. Signals may be triggered to propagate from a source to a destination by an edge (e.g., rising or falling voltage level) of the system clock signal and may be captured at another clock edge. The state of a signal may be captured and stored in a sequential storage circuit such as a latch, flip-flop, register, bit cell or other memory circuit. The signal to be captured may be a binary value (e.g., "0" or "1") indicated by a voltage level (e.g., $V_{SS}$ or $V_{DD}$, respectively), for example. The voltage level of a signal may be captured accurately and reliably when the received signal is held stable. In addition, variations in a signal controlling a read or write operation can cause errors in data written to and read from the memory array circuit. As processing circuit speeds increase, a period of the system clock signal becomes shorter, leaving less time for signals to stabilize. Memory arrays need to receive and decode memory addresses within a short clock period and improve timing robustness.

SUMMARY

Exemplary aspects disclosed herein include memory array circuits including word line circuits for improved word line signal timing. Related methods of providing stable word line signals in a memory array are also disclosed. In an exemplary aspect, memory access operation, the states of word line signals on word lines in the memory rows of the memory array may be generated based on word line latches during a first clock state of a latch clock signal. The word line latches receive address decode signals generated from a decoded memory address. An inverted delay clock circuit is configured to generate a self-timed pulse from the latch clock signal in the first clock state. The word line latches store the address decode signals during the self-timed pulse and generate word line signals based on the stored address decode signals, isolating the word lines from fluctuations in the memory address. In some examples, the memory address may be received from an address capture circuit coupled to an address bus. The address capture circuit may include pass-through latches to maximize time for a decoder to decode the memory address. However, any fluctuations in the memory address may propagate through the pass-through latches to the address decode signals. The word line latches hold the word lines stable during a memory access operation. In this regard, a time for generating a more stable word line signal to access a memory row is maximized and fluctuations in the word line signals during a memory access operation are reduced.

Exemplary aspects disclose herein include a memory array circuit comprising a plurality of memory rows, each comprising a plurality of memory bit cell circuits, and a word line coupled to each of the plurality of memory bit cell circuits. The memory array circuit includes an inverted delay clock circuit configured to receive a latch clock signal comprising one of a first clock state and a second clock state, generate an inverted delay clock signal comprising the second clock state in response to receiving the latch clock signal comprising the first clock state, and generate the inverted delay clock signal comprising the first clock state in response to receiving the latch clock signal comprising the second clock state. The memory array circuit also includes a plurality of word line latch circuits each coupled to the word line of one of the plurality of memory rows and configured to receive the latch clock signal and the inverted delay clock signal and receive an address decode signal comprising a decode state comprising one of an active state and an inactive state. Each of the plurality of word line latches is further configured to, in response to the latch clock signal comprising the first clock state and the inverted delay clock signal comprising the first clock state, store the decode state of the received address decode signal and generate a word line signal comprising the stored decode state of the address decode signal on the word line in the one of the plurality of memory rows. Each of the plurality of word line latch circuits is further configured to hold the word line signal in the stored decode state of the address decode signal on the word line in the one of the plurality of memory rows in response to the latch clock signal comprising the first clock state and the inverted delay clock signal comprising the second clock state, and generate the word line signal comprising the inactive state of the address decode signal on the word line in the one of the plurality of memory rows in response to the latch clock signal comprising the second clock state.

In an exemplary aspect, an integrated circuit (IC) comprising a memory array circuit is disclosed. The memory array circuit comprises a plurality of memory rows, each comprising a plurality of memory bit cell circuits, and a word line coupled to each of the plurality of memory bit cell circuits. The memory array circuit includes an inverted delay clock circuit configured to receive a latch clock signal comprising one of a first clock state and a second clock state, generate an inverted delay clock signal comprising the second clock state in response to receiving the latch clock signal comprising the first clock state, and generate the inverted delay clock signal comprising the first clock state in response to receiving the latch clock signal comprising the second clock state. The memory array circuit also includes a plurality of word line latch circuits each coupled to the word line of one of the plurality of memory rows and configured to receive the latch clock signal and the inverted delay clock signal and receive an address decode signal comprising a decode state comprising one of an active state and an inactive state. Each of the plurality of word line latch circuits is further configured to, in response to the latch clock signal comprising the first clock state and the inverted delay clock signal comprising the first clock state, store the decode state of the received address decode signal and generate a word line signal comprising the stored decode state of the address decode signal on the word line in the one of the plurality of memory rows. Each of the plurality of word line latch circuits is further configured to hold the word line signal in the stored decode state of the address decode signal on the word line in the one of the plurality of memory rows in response to the latch clock signal comprising the first clock state and the inverted delay clock signal comprising the second clock state, and generate the word line signal comprising the inactive state of the address decode signal on the word line in the one of the plurality of memory rows in response to the latch clock signal comprising the second clock state.

In another exemplary aspect, a method in a memory array circuit comprising a plurality of memory rows each comprising memory bit cell circuits coupled to a word line is disclosed. The method comprises receiving a latch clock signal comprising one of a first clock state and a second clock state, generating an inverted delay clock signal comprising the first clock state in response to the latch clock signal comprising the second clock state, and generating the inverted delay clock signal comprising the second clock state in response to the latch clock signal comprising the first clock state. The method includes receiving, in one of the plurality of memory rows, an address decode signal comprising a decode state comprising one of an active state and an inactive state and, in response to the latch clock signal comprising the first clock state and the inverted delay clock signal comprising the first clock state, storing the decode state of the received address decode signal and generating the stored decode state of the address decode signal on the word line in the one of the plurality of memory rows. The method further includes, in response to the latch clock signal comprising the first clock state and the inverted delay clock signal comprising the second clock state, generating the stored decode state of the address decode signal on the word line in the one of the plurality of memory rows. The method further includes, in response to the latch clock signal comprising the second clock state, generating the inactive state of the address decode signal on the word line in the one of the plurality of memory rows.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
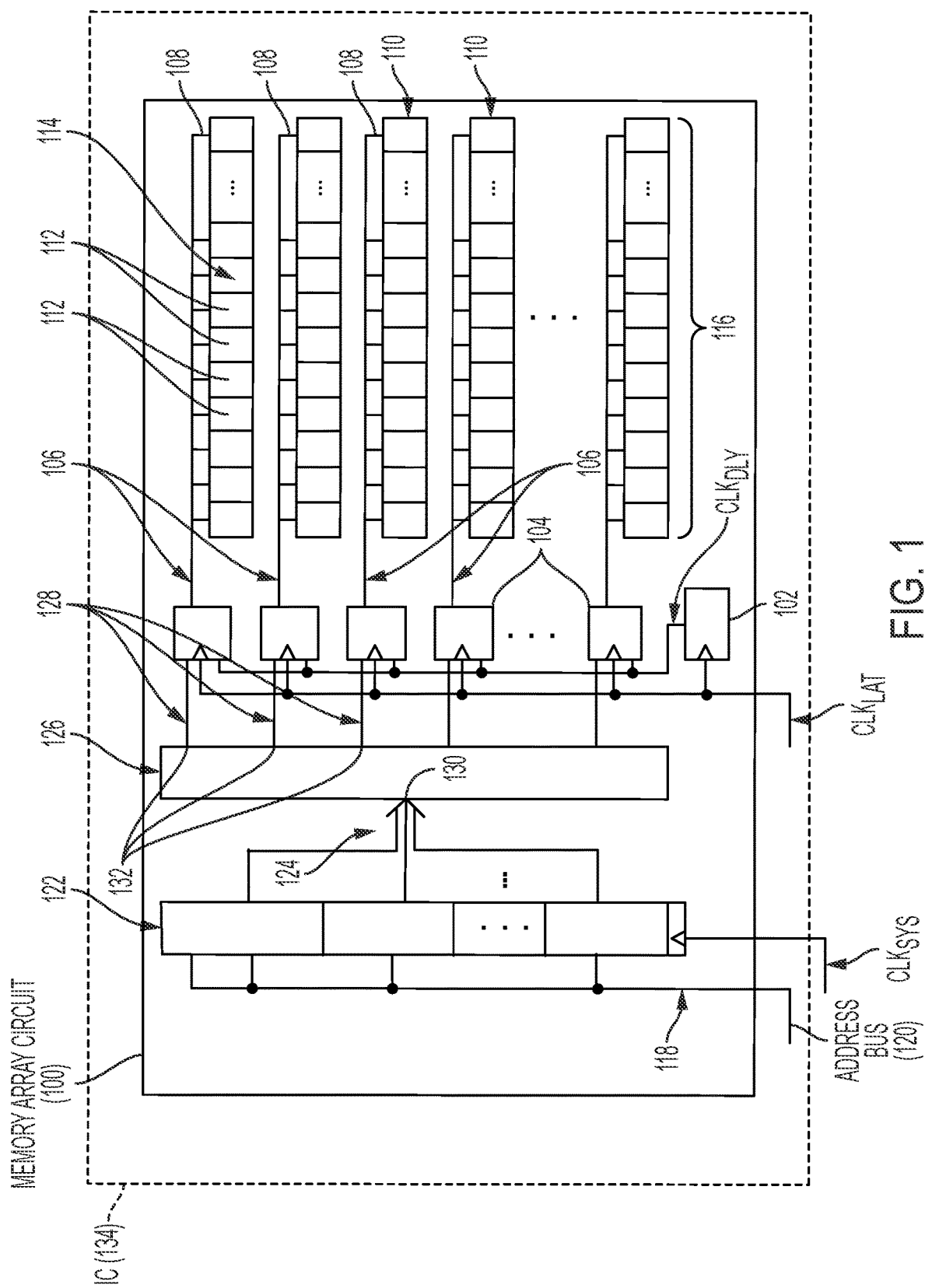
FIG. 1 is a schematic diagram of a memory array circuit including an inverted delay clock circuit configured to generate a self-timed pulse in a first clock state of a latch clock signal and word line latches configured to capture address decode signals during the self-timed pulse and generate word line signals on word lines during the first clock state based on the word line latches.
Figure 5A:
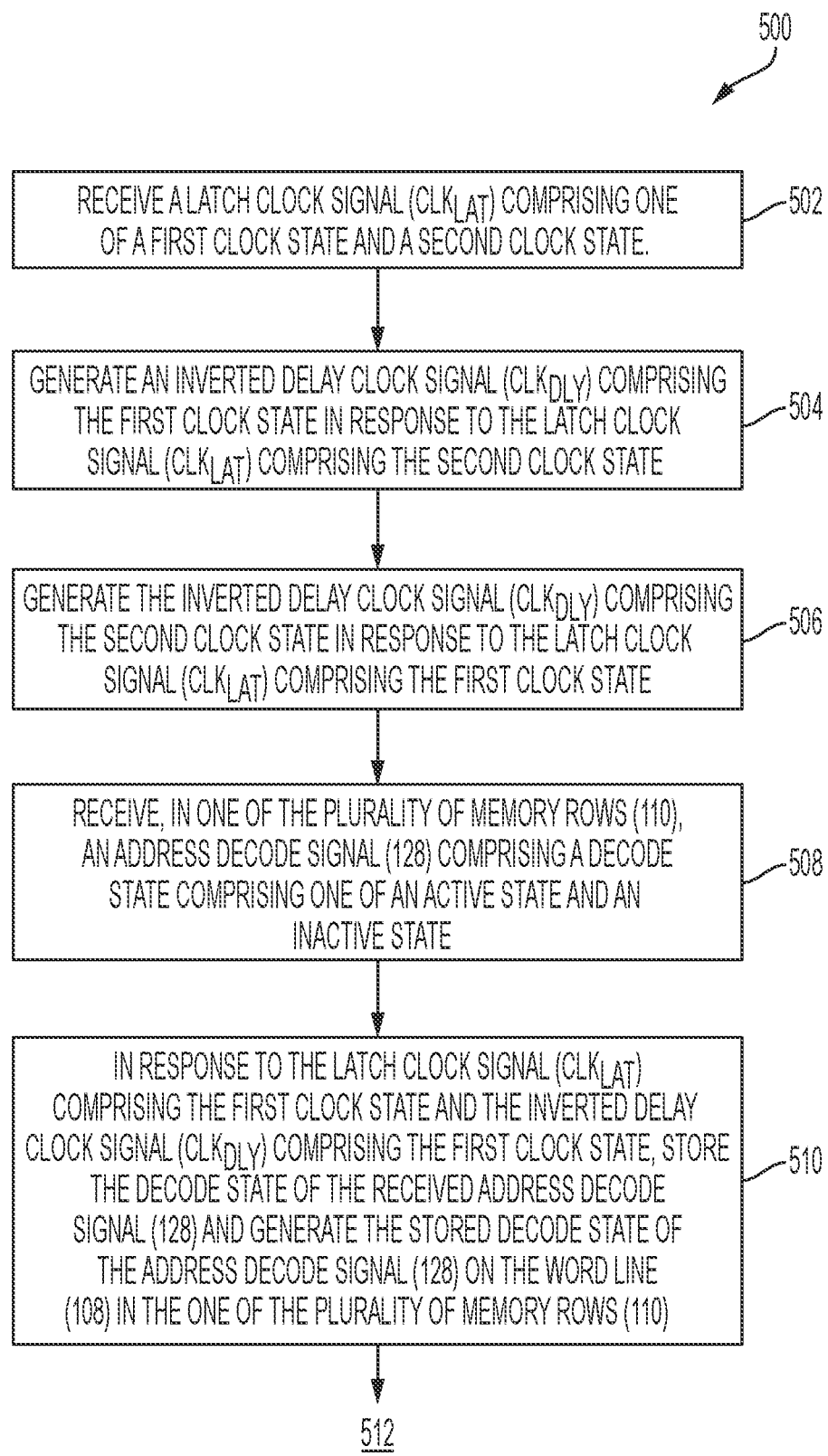
Figure 5B:
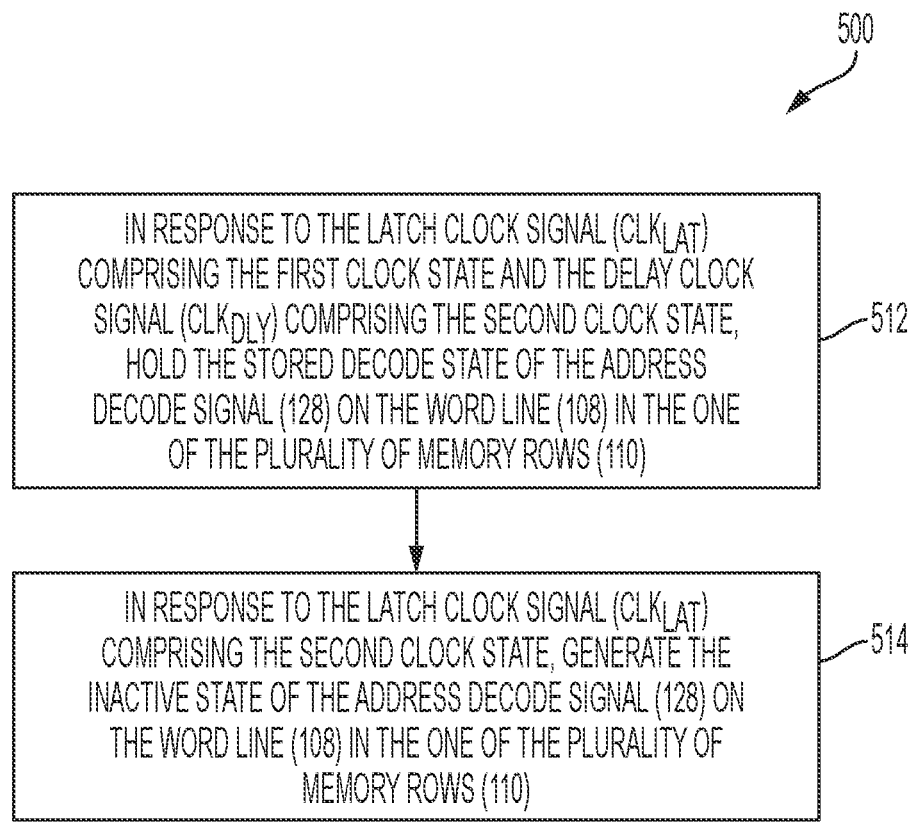
Figure 6:
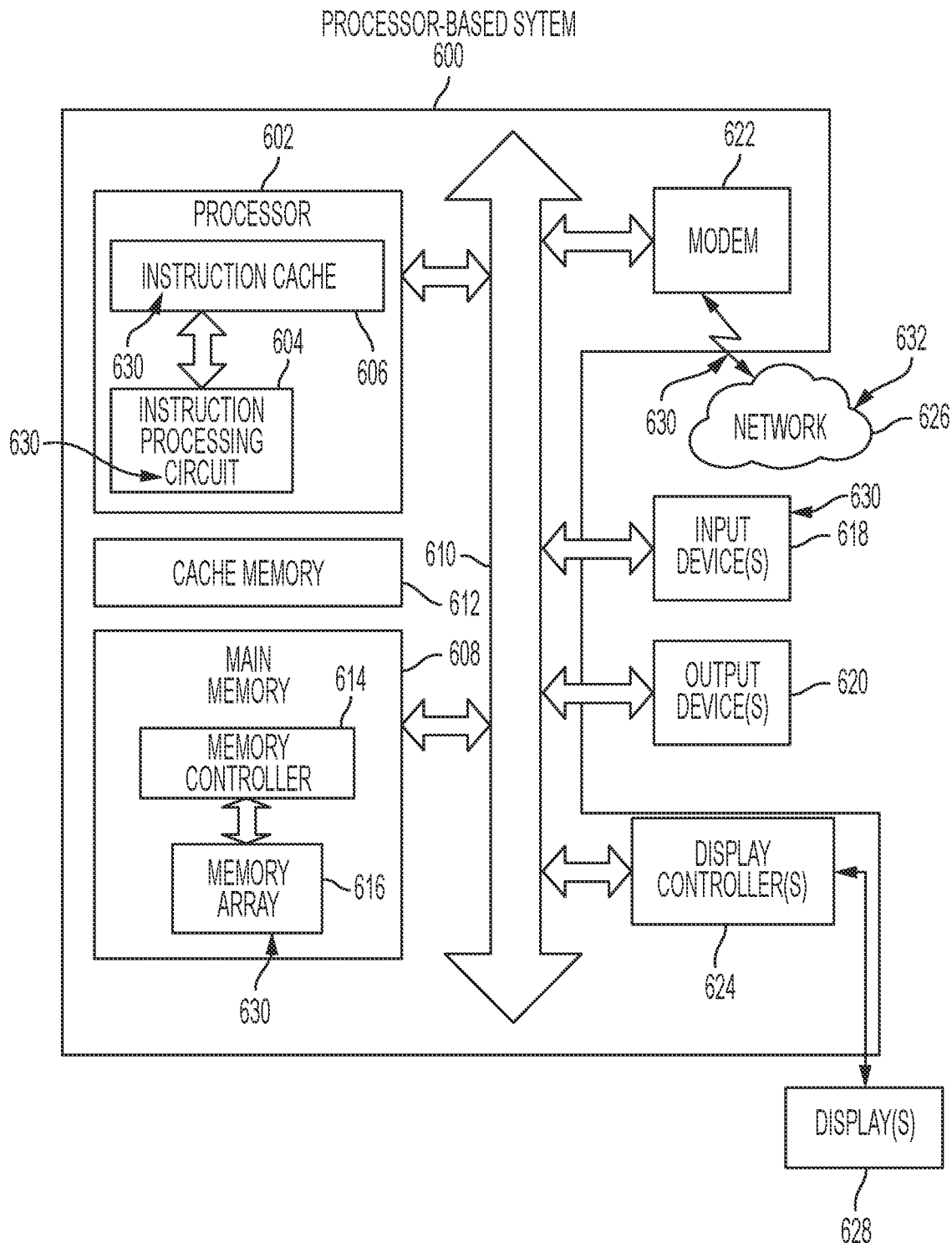

FIGS. 5A and 5B are a flowchart illustrating a method in a memory array circuit for capturing address decode signals in response to a self-timed pulse to reduce word line signal errors due to address bus variations; and FIG. 6 is a block diagram of an exemplary processor-based system including a plurality of devices coupled to a system bus, wherein the processor-based system includes an inverted delay clock circuit configured to generate a self-timed pulse in a first clock state of a latch clock and word line latches configured to capture address decode signals during the self-timed pulse and generate word lines during the first clock state based on the word line latches, as in the memory array circuits shown in FIG. 1.

DETAILED DESCRIPTION

Exemplary aspects disclosed herein include memory array circuits including word line circuits for improved word line signal timing. Related methods of providing stable word line signals in a memory array are also disclosed. In an exemplary aspect, memory access operation, the states of word line signals on word lines in the memory rows of the memory array may be generated based on word line latches during a first clock state of a latch clock signal. The word line latches receive address decode signals generated from a decoded memory address. An inverted delay clock circuit is configured to generate a self-timed pulse from the latch clock signal in the first clock state. The word line latches store the address decode signals during the self-timed pulse and generate word line signals based on the stored address decode signals, isolating the word lines from fluctuations in the memory address. In some examples, the memory address may be received from an address capture circuit coupled to an address bus. The address capture circuit may include pass-through latches to maximize time for a decoder to decode the memory address. However, any fluctuations in the memory address may propagate through the pass-through latches to the address decode signals. The word line latches hold the word lines stable during a memory access operation. In this regard, a time for generating a more stable word line signal to access a memory row is maximized and fluctuations in the word line signals during a memory access operation are reduced.

FIG. 1 is a schematic diagram of an exemplary memory array circuit 100 including an inverted delay clock circuit 102 and a plurality of word line latch circuits ("word line latches") 104 configured to generate stable word line signals 106 on word lines 108. The memory array circuit 100 may be coupled to a processing circuit (not shown) that is configured to execute memory access instructions. The memory array circuit 100 includes memory rows 110 that include a plurality of memory bit cell circuits ("memory bit cells") 112. Each of the memory bit cells 112 store a data bit 114 of a data word 116. Data words 116 may be accessed (e.g., read or written) in a memory access operation in response to a memory instruction executed in the processing circuit. The memory array circuit 100 determines the memory row 110 containing the data word 116 to be accessed in a memory access operation based on an address signal 118 received on an address bus 120. The address signal 118 is received in an address capture circuit 122. The address signal 118 is captured and stored in the address capture circuit 122 and held on an internal address bus 124 while a system clock signal $CLK_{SYS}$ ("system clock $CLK_{SYS}$") is in a first clock state. After the system clock $CLK_{SYS}$ transitions from the first clock state to a second clock state, the address signal 118 provided on the address bus 120 may propagate through the address capture circuit 122 to the internal address bus 124. In this regard, the address capture circuit 122 may be referred to as a pass-through circuit when the system clock $CLK_{SYS}$ is not in the first clock state.

It should be noted that a state of a signal, such as the first and second clock states of the system clock $CLK_{SYS}$, refers to an electrical state of a signal on a line or conductor. For example, a clock state or signal state may refer to a voltage level of a signal generated at a first voltage level in a first state and at a second voltage level in a second state. In this regard, the voltage levels may correspond to binary values and may include a ground voltage (e.g., $V_{SS}$ or 0 volts) indicating a first binary state ("0" or "1") and a power supply voltage (e.g., $V_{DD}$) indicating the other binary state ("1" or "0"), where a power supply voltage may be a positive or negative voltage.

From the internal address bus 124, the address signal 118 is provided to a decoding circuit 126 that decodes the address signal 118 to identify the memory row 110 to be accessed. The decoding circuit 126 generates address decode signals 128 corresponding to each of the memory rows 110. Each of the address decode signals 128 is in a decode state (i.e., an active state or an inactive state) based on the address signal 118. For example, if the memory array circuit 100 includes 256 memory rows 110, the address signal 118 may include 8 bits, and the decoding circuit 126 may generate up to $2^8$ (256) address decode signals 128, each one corresponding to one of the memory rows 110. One of the address decode signals 128 corresponds to the address signal 118 and that one is driven to an active state for the memory access operation while the address decodes signals 128 of the other memory rows 110 are in an inactive state. The address decode signals 128 are received in the word line latches 104 from which the word line signals 106 are generated. The word line latches 104 operate in response to a latch clock signal $CLK_{LAT}$ that may be synchronized to the system clock $CLK_{SYS}$ rising. The second clock state starting of $CLK_{LAT}$ and $CLK_{SYS}$ might or might not be synchronized to each other in different implementations.

With further reference to the address capture circuit 122, the address signal 118 is captured and held stable while the system clock $CLK_{SYS}$ is in the first clock state. During this state, the address signal 118 is held constant on the internal address bus 124 and the decoding circuit 126 to provide unfluctuating address decode signals 128 to the word line latches 104. When the system clock $CLK_{SYS}$ is in the second clock state, the address signals 118 pass through the address capture circuit 122 and into the decoding circuit 126. Any fluctuations in the address signal 118 on the address bus 120 may cause state changes in the address decode signals 128. In this context, the term "variation" with regard to the address signal 118 refers to binary bits on the address bus 120 changing from a "0" to a "1" or from a "1" to a "0", or other instability in the signals on the address bus 120 that may cause the decoded address indicated by the address signal 118 to change. Variations or instability, such as a voltage fluctuation, of the word line signals 106 on the word lines 108 during a memory access operation can cause an error in the memory access operation. For example, in a memory read operation, changes to the word line signal 106 on the memory row 110 that is being read from may cause incorrect data to be generated on the bit lines in the memory array circuit 100, resulting in a memory read error.

As previously noted, the word line latches 104 operate in response to the latch clock signal $CLK_{LAT}$, which rises in synchronization with the system clock $CLK_{SYS}$. Specifically, in response to the system clock $CLK_{SYS}$ transition from the second clock state to the first clock state (e.g., a rising edge of a clock), the latch clock signal $CLK_{LAT}$ also changes from the second clock state to the first clock state. The word line signals 106 are generated in an active state on the word lines 108 only when the latch clock signal $CLK_{LAT}$ is in the first state. The word line signals 106 are generated in an inactive state in response to the latch clock signal $CLK_{LAT}$ being in the second clock state. The system clock $CLK_{SYS}$ may not remain in the first clock state through the entire memory access operation. Thus, to keep the word line signals 106 active long enough to perform a memory access operation, the latch clock signal $CLK_{LAT}$ may not transition back to the second clock state in response to the system clock transitioning to the second clock state. In other words, the duty cycle of the latch clock signal $CLK_{LAT}$ may be longer than that of the system clock $CLK_{SYS}$. With the system clock $CLK_{SYS}$ in the second clock state, if the address decode signals 128 were provided to the word line latches 104 through combinational logic, the word line signals 106 could become unstable while the latch clock signal $CLK_{LAT}$ is still in the first clock state.

Thus, rather than passing the unstable address decode signals 128 through the word line latches 104 while the latch clock signal $CLK_{LAT}$ is in the first clock state, the word line latches 104 are configured to store decode states of the address decode signals 128 and generate the word line signals 106 based on the stored decode states. In further detail, the inverted delay clock circuit 102 is configured to receive the latch clock signal $CLK_{LAT}$ and, in response to receiving the latch clock signal $CLK_{LAT}$ in the first clock state, the inverted delay clock circuit 102 is further configured to generate an inverted delay clock signal $CLK_{DLY}$ in the second clock state. However, the inverted delay clock circuit 102 generates the inverted delay clock signal $CLK_{DLY}$ after a delay period, which is the time for the latch clock signal $CLK_{LAT}$ to propagation through the inverted delay clock circuit 102.

The word line latches 104 receive the inverted delay clock signal $CLK_{DLY}$ and receive the address decode signals 128 in one of two decode states, either an active state or an inactive state. The word line latches 104 store the decode state of the address decode signals 128 in response to the latch clock signal $CLK_{LAT}$ in the first clock state and the inverted delay clock signal $CLK_{DLY}$ also in the first clock state. That is, prior to the inverted delay clock signal $CLK_{DLY}$ transitioning from the first clock state to the second clock state in response to the transition of the latch clock signal $CLK_{LAT}$ from the second clock state to the first clock state, both of the latch clock signal $CLK_{LAT}$ and the inverted delay clock signal $CLK_{DLY}$ are in the first clock state. This occurs while the system clock $CLK_{SYS}$ is still in the first clock state and the address decode signals 128 are held stable by the address capture circuit 122. In this condition, the word line latches 104 capture the address decode signals 128 and generate the word line signals 106 on the word lines 108 based on the stored decode states of the address decode signals 128. One of the word lines 108 for the target memory row 110 of the memory access operation receives a word line signal 106 in an active state based on the address signal 118. The word lines 108 of the other (e.g., 255 out of 256) memory rows 110 receive a word line signal 106 in an inactive state.

As noted, the transition of the latch clock signal $CLK_{LAT}$ to the first clock state propagates through the inverted delay clock circuit 102 and causes the inverted delay clock signal $CLK_{DLY}$ to transition to the second clock state upon expiration of a delay period. In response to the latch clock signal $CLK_{LAT}$ in the first clock state and the inverted delay clock signal $CLK_{DLY}$ in the second clock state, the word line latches 104 hold the word line signals 106 on the word lines 108 in the stored decode states of the address decode signals 128. The latch clock signal $CLK_{LAT}$ transitions back to the second clock state and, in response to the latch clock signal $CLK_{LAT}$ in the second clock state, the word line latches 104 generate the word line signals 106 in the inactive state on the word lines 108.

Figure 2:
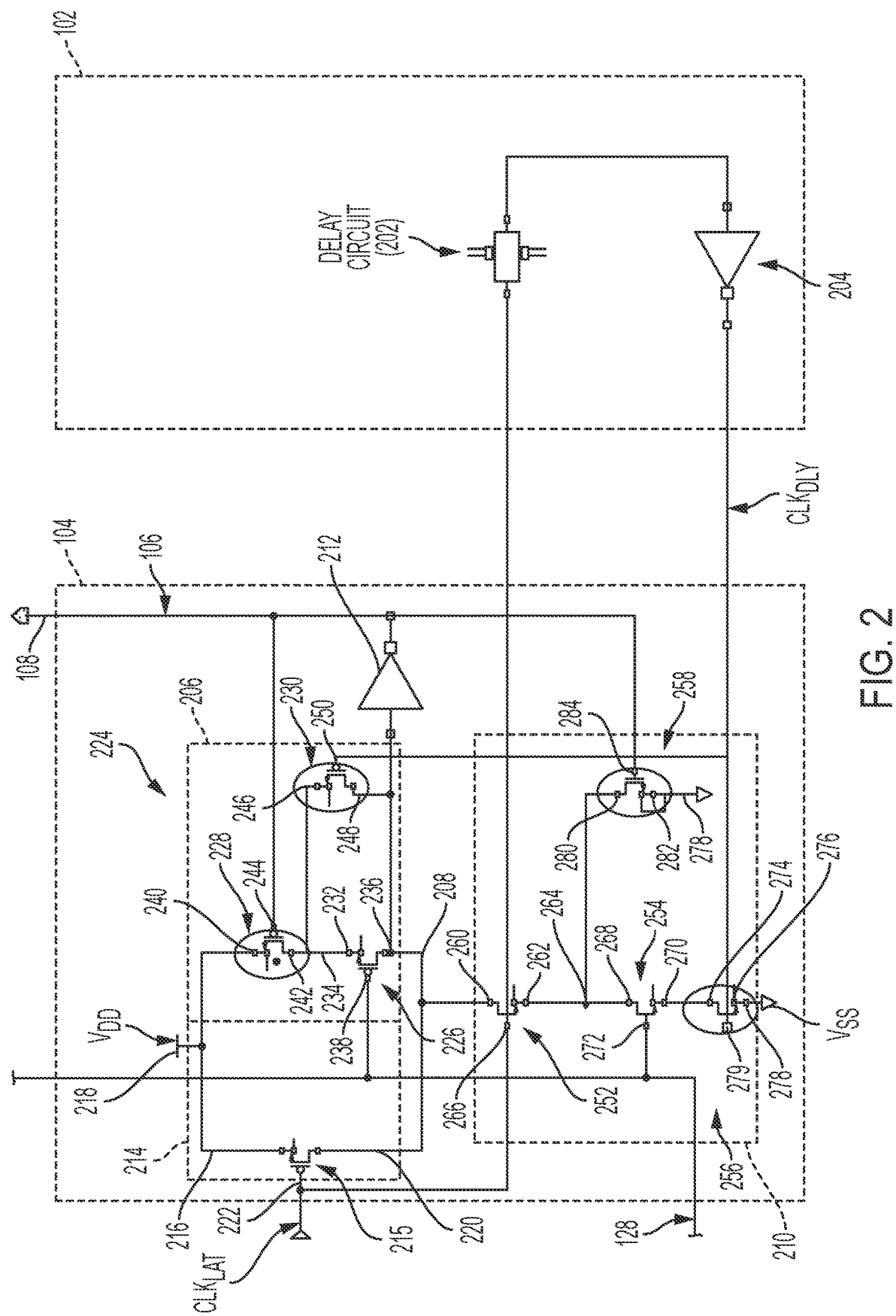
FIG. 2 is a schematic diagram of the exemplary inverted delay clock circuit and word line latches of the memory array circuit in FIG. 1 and configured to reduce fluctuations in a word line signal.

FIG. 2 is a schematic diagram provided for reference in a detailed description of an example of the inverted delay clock circuit 102 and the word line latches 104 in FIG. 1, which are configured to reduce fluctuations in the word line signals 106. The latch clock signal $CLK_{LAT}$ is inverted and the delay period or "self-timed pulse" is created by the inverted delay clock circuit 102, which includes a delay circuit 202 that receives the latch clock signal $CLK_{LAT}$ and an inverter circuit 204. The inverter circuit 204 includes an input coupled to the delay circuit 202. A propagation delay of the latch clock signal $CLK_{LAT}$ through the inverted delay clock circuit 102 creates the self-timed pulse to the word line latches 104 during which the decode states of the address decode signals 128 are expected to be stable (i.e., while the system clock $CLK_{SYS}$ is in the first clock state). The word line signals 106 are generated by the stored address decode signals 128 and are not exposed to variations in the address signal 118 after the self-timed pulse. The self-timed pulse begins when the latch clock signal $CLK_{LAT}$ transitions to a first clock state from a second clock state and the inverted delay clock signal $CLK_{DLY}$ is still in the first clock state. The duration of the self-timed pulse is determined by the time of a propagation delay of the latch clock signal $CLK_{LAT}$ through the inverted delay clock circuit 102 (i.e., until expiration of the delay period). The self-timed pulse ends when the inverted delay clock signal $CLK_{DLY}$ transitions to the second clock state.

FIG. 2 shows that the word line latch 104 includes a pull-up circuit 206 coupled to an internal node 208, and a pull-down circuit 210 coupled to the internal node 208. The word line latch 104 also includes an inverter circuit 212 coupled to the internal node 208 and the word line 108. The pull-up circuit 206 includes a first transistor circuit 214 that is configured to pull up (e.g., a voltage level) the internal node 208 to a supply voltage (e.g., $V_{DD}$) in response to the latch clock signal $CLK_{LAT}$ being in the second clock state. The active state generated on the internal node 208 is inverted by the inverter circuit 212 to generate the word line signal 106 in an inactive state on the word line 108.

The first transistor circuit 214 includes a pull-up transistor 215, which further includes a first terminal 216 coupled to a supply voltage node 218 that provides the supply voltage $V_{DD}$. The pull-up transistor 215 includes a second terminal 220 coupled to the internal node 208. The pull-up transistor 215 also includes a gate terminal 222 configured to control coupling the supply voltage node 218 to the internal node 208 in response to the latch clock signal $CLK_{LAT}$ in the second clock state.

The pull-up circuit 206 also includes a keep-up circuit 224 configured to maintain a stored inactive state of the word line signal 106. In response to the word line signal 106 in the inactive state, the keep-up circuit 224 is configured to hold (i.e., the voltage level of) the internal node 208 to the supply voltage $V_{DD}$ under either of two conditions. First, in the condition that the address decode signal 128 provided to the word line latch 104 is in the inactive state and the word line signal 106 is in the inactive state, the internal node 208 may be held up in the active state by the pull-up circuit 206. Second, in the condition that the inverted delay clock signal $CLK_{DLY}$ is in the second clock state and the word line signal 106 is in the inactive state, the internal node 208 may be held up in the active state by the pull-up circuit 206. In either of these conditions, the active state generated on the internal node 208 is inverted by the inverter circuit 212 to continue to generate the word line signal 106 in an inactive state on the word line 108.

In detail, the keep-up circuit 224 includes a second transistor 226, a third transistor 228, and a fourth transistor 230. The pull-up transistor 215, second transistor 226, third transistor 228, and fourth transistor 230 may be P-type metal-oxide semiconductor (PMOS) transistors but are not limited in this regard. An example of a P-type transistor is a silicon transistor doped with a pentavalent dopant such as aluminum, indium or gallium. The second transistor 226 includes a first terminal 232 coupled to a pull-up node 234, a second terminal 236 coupled to the internal node 208, and a gate terminal 238. The gate terminal 238 is configured to control coupling the pull-up node 234 to the internal node 208 in response to the address decode signal 128 in the inactive state. The third transistor 228 includes a first terminal 240 coupled to the supply voltage node 218, a second terminal 242 coupled to the pull-up node 234, and a gate terminal 244. The gate terminal 244 is configured to control coupling the supply voltage node 218 to the pull-up node in response to the word line signal 106 in the inactive state. The fourth transistor 230 includes a first terminal 246 coupled to the pull-up node 234, a second terminal 248 coupled to the internal node 208, and a gate terminal 250. The gate terminal 250 is configured to control coupling the pull-up node 234 to the internal node 208 in response to the inverted delay clock signal $CLK_{DLY}$ in the second clock state.

The pull-down circuit 210 is configured to pull-down (i.e., a voltage level of) the internal node 208 to a second supply voltage, such as a ground voltage, in the condition that the latch clock signal $CLK_{LAT}$ is in the first clock state when one of two additional conditions exist. First, the pull-down circuit 210 may hold down the internal node 208 when the latch clock signal $CLK_{LAT}$ is in the first clock state and the word line signal 106 on the word line 108 is in the active state. Second, the pull-down circuit 210 may pull-down the internal node 208 if the latch clock signal $CLK_{LAT}$ is in the first clock state, the address decode signal 128 is in the active state, and the inverted delay clock signal $CLK_{DLY}$ is in the first clock state.

In detail, the pull-down circuit 210 includes a fifth transistor 252, a sixth transistor 254, a seventh transistor 256, and an eighth transistor 258. The fifth transistor 252, sixth transistor 254, seventh transistor 256, and eighth transistor 258 may be N-type metal-oxide semiconductor (NMOS) transistors but are not limited in this regard. An example of an N-type transistor is a silicon transistor doped with a trivalent dopant such as arsenic, antimony, or bismuth. The fifth transistor 252 includes a first terminal 260 coupled to the internal node 208, a second terminal 262 coupled to a pull-down node 264, and a gate terminal 266. The gate terminal 266 is configured to control coupling the internal node 208 to the pull-down node 264 in response to the latch clock signal $CLK_{LAT}$ in the first clock state. The sixth transistor 254 includes a first terminal 268 coupled to the pull-down node 264, a second terminal 270, and a gate terminal 272. The gate terminal 272 is configured to control coupling the pull-down node 264 to the second terminal 270 in response to the address decode signal 128 in the active state. The seventh transistor 256 of the pull-down circuit 210 includes a first terminal 274 coupled to the second terminal 270 of the sixth transistor 254 and a second terminal 276 coupled to a second supply voltage node 278 providing the second supply voltage (e.g., Vss or ground). A gate 279 controls coupling the second supply voltage node 278 to the first terminal 274 of the seventh transistor 256 in response to the inverted delay clock signal $CLK_{DLY}$ in the first clock state. The eighth transistor 258 includes a first terminal 280 coupled to the pull-down node 264, a second terminal 282 coupled to the second supply voltage node 278, and a gate terminal 284. The gate terminal 284 is configured to control coupling the second supply voltage node 278 to the pull-down node 264 in response to the word lines signal 106 in the active state.

Referring back to FIG. 1, a detailed description of the decoding circuit 126 and the address capture circuit 122 are provided. The decoding circuit 126 includes an input 130 coupled to the internal address bus 124 and a plurality of outputs 132 each coupled to one of the plurality of word line latches 104. The decoding circuit 126 is configured to receive the address signal 118 on the internal address bus 124, decode the address signal 118, and generate the decode states of the address decode signals 128 on the outputs 132. In particular, on the one output 132 corresponding to the address signal 118, the decoding circuit 126 is configured to generate the address decode signal 128 in the active state. On the other outputs 132 (i.e., not corresponding to the address signal 118), the decoding circuit 126 is configured to generate the address decode signal 128 in the inactive state. The memory array circuit 100 may be included in an integrated circuit (IC) 134 that further includes a processing circuit (not shown), for example.

The second clock state active pass-through address capture circuit 122 is coupled to the internal address bus 124 and also to the address bus 120. The address capture circuit 122 is configured to receive the address signal 118 on the address bus 120 and receive the system clock $CLK_{SYS}$. In response to the system clock $CLK_{SYS}$ in the active state, the address capture circuit 122 stores the address signal 118 and holds, on the internal address bus 124, the address signal 118 stored in the address capture circuit 122. Also, in response to the system clock $CLK_{SYS}$ in the inactive state, the address capture circuit 122 generates, on the internal address bus 124, the address signal 118 received on the address bus 120. While the system clock $CLK_{SYS}$ in inactive state, the address capture circuit 122 is in pass-through state to maximize time available for address decoding.

Figure 3:
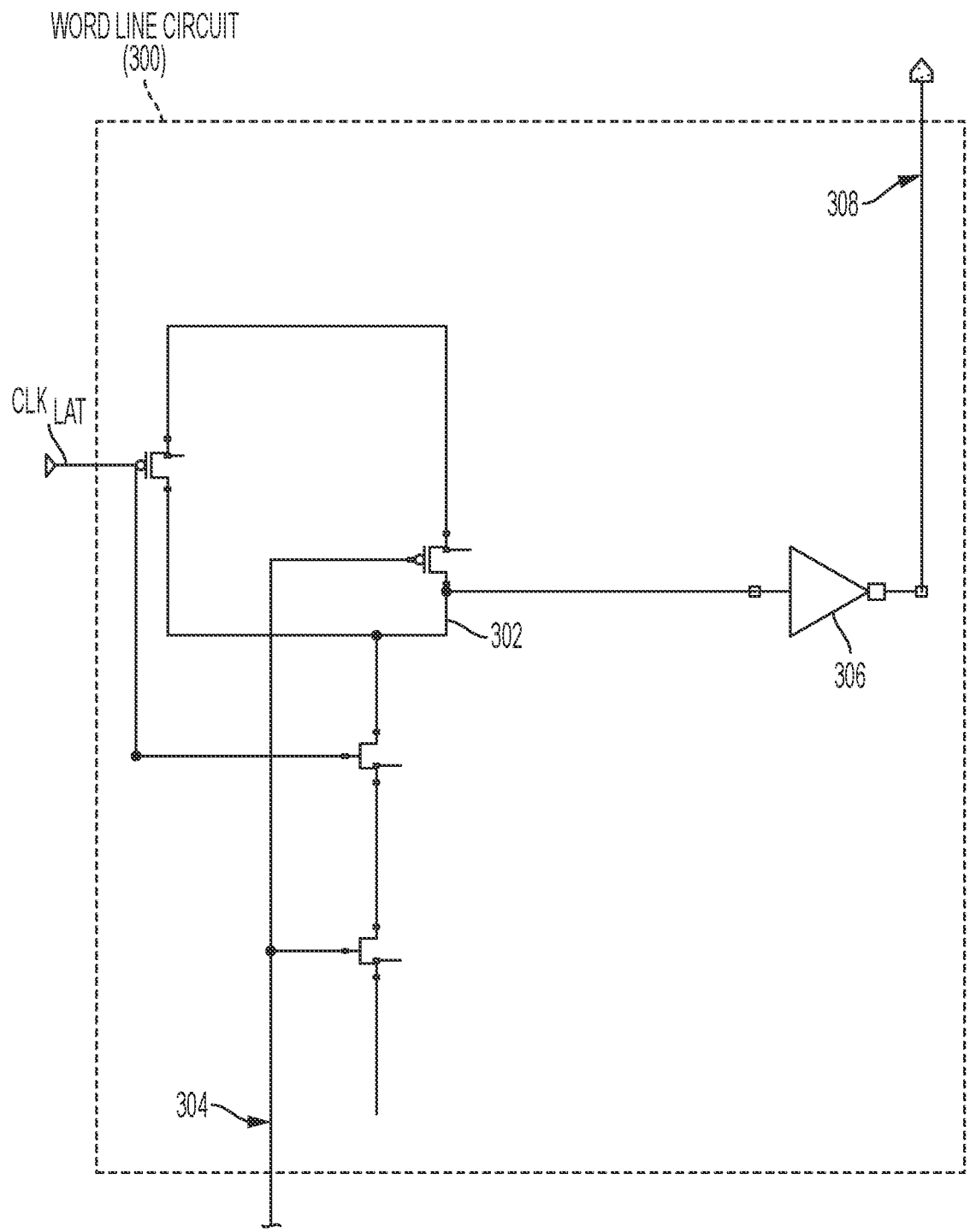
FIG. 3 is a schematic diagram of a word line circuit employed in a conventional memory array in which fluctuations on the address bus are propagated to cause fluctuations and hold time violations on the word lines.

FIG. 3 is an illustration of a word line circuit 300 employed in a conventional memory array in which fluctuations on the address bus are propagated and may become fluctuations and timing margin violations on the word lines. An internal node 302 is pulled up to an active state whenever the latch clock signal $CLK_{LAT}$ is in the second clock state and also whenever an address decode signal 304 is in an inactive state. The internal node 302 is pulled down under the condition of the latch clock signal $CLK_{LAT}$ being in the first clock state and the address decode signal 304 being in the active state. An inverter 306 generates a word line signal 308 that is an inverse of a state of the internal node 302. Thus, the word line circuit 300 does not store the address decode signal 304 and, instead, generates the word line signal 308 combinationally based on the address decode signal 304, including any fluctuations or timing variations, which may potentially cause errors in memory access operations.

Figure 4:
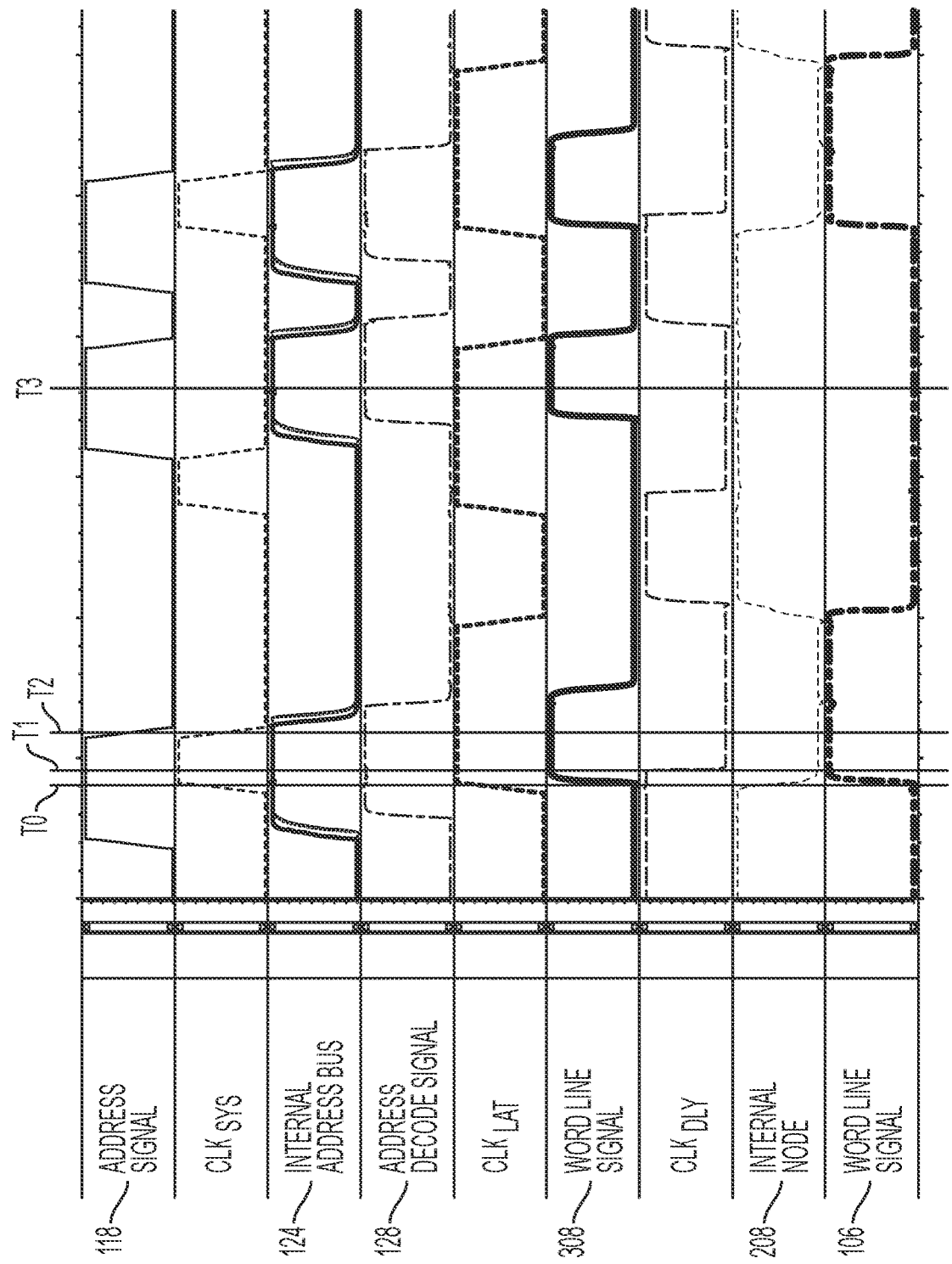
FIG. 4 is a timing diagram illustrating the states of signals in a conventional memory array circuit employing the word line latch in FIG. 3 and signals of the exemplary memory array circuit in FIG. 1 employing the exemplary inverted delay clock circuit and word line latches in FIG. 2.

FIG. 4 is a timing diagram illustrating the states of signals in the conventional memory array circuit employing the word line circuit 300 in FIG. 3 and signals of the exemplary memory array circuit 100 in FIG. 1 employing the exemplary inverted delay clock circuit 102 and word line latches 104 in FIGS. 1 and 2. Signals in FIG. 4 are referred to using the same labels as in FIGS. 1-3. The signals are described below in descending order from the first signal (address signal 118) at the top of the timing diagram in FIG. 4. As indicated, the first signal in FIG. 4 is the address signal 118 arriving on the address bus 120. Prior to the time T0, the address signal 118 transitions from the second clock state (e.g., low) to the first clock state (e.g., high) based on a memory address provided by a processing circuit. The second signal in FIG. 4 is the system clock $CLK_{SYS}$. At time T0 the system clock $CLK_{SYS}$ transitions from a second clock state to a first clock state, remains in the first clock state for a time based on the clock duty cycle, and transitions back, at time T2, to the second clock state. The address capture circuit 122 in FIG. 1 captures the state of the address signal 118 in response to the system clock $CLK_{SYS}$ being in the first clock state from time T0 to time T2. The address capture circuit 122 holds the captured state of the address signal 118 on the internal address bus 124 from time T0 to time T2, when the system clock $CLK_{SYS}$ transitions back to the second clock state.

The third signal shown in FIG. 4 is the internal address bus 124 carrying the address signal 118. Before the time T0 and after the time T2, the address signal 118 propagates through the address capture circuit 122 from the address bus 120 to the internal address bus 124. Thus, any fluctuations that may occur on the address bus 120 before time T0 and after time T2 cause fluctuations on the address signal 118 on the internal address bus 124.

The fourth signal in FIG. 4 is the address decode signal 128 corresponding to the address signal 118 on the internal address bus 124. Before time T3, the address signal 118 has transitioned from an inactive state to an active state and transitions back to the inactive state after time T3, as an example of a fluctuation in the address signal 118. Because the address capture circuit is a pass-through latch when the system clock $CLK_{SYS}$ is in the second clock state, the address decode signal 128 transitions from an inactive state to an active state and back to the inactive state. Thus, fluctuations on the address signal 118 on the address bus 120 are propagated through the address capture circuit 122 and through the decoding circuit 126.

The fifth signal in FIG. 4 is the latch clock signal $CLK_{LAT}$, which rises in synchronization with the system clock $CLK_{SYS}$. The amount of time the latch clock signal $CLK_{LAT}$ remains in the first clock state may be determined by a self-timed circuit or in another manner. In this regard, the latch clock signal $CLK_{LAT}$ transitions (e.g., rises) from the second clock state to the first clock state in response to the system clock $CLK_{SYS}$ at time T0, but the latch clock signal $CLK_{LAT}$ has a longer duty cycle than the system clock $CLK_{SYS}$.

The sixth signal in FIG. 4 is the word line signal 308 generated in the word line circuit 300 in the conventional memory array circuit. The word line signal 308 is an example of a problem with the conventional method, for purposes of comparison. As shown in FIG. 4, any fluctuations to the address signal 118 on the address bus 120 (e.g., time T3), when the system clock $CLK_{SYS}$ is in the second clock state, are propagated through the word line circuit 300 to cause variations in the word line signal 308.

The seventh signal in FIG. 4 is the inverted delay clock signal $CLK_{DLY}$. As shown, the state of the inverted delay clock signal $CLK_{DLY}$ is based on the delayed and inverted state of the latch clock signal $CLK_{LAT}$. The word line latches 104 in FIG. 1 capture and store the address decode signals 128 when both the latch clock signal $CLK_{LAT}$ and the inverted delay clock signal $CLK_{DLY}$ are in the first clock state (e.g., high). This condition exists from time T0 to time T1, which is referred to herein as a self-timed pulse. The word line signals 106 are held in a state determined by the captured address decode signals 128 until the latch clock signal $CLK_{LAT}$ transitions to the second clock state (e.g., falls to a low state). After the latch clock signal $CLK_{LAT}$ transitions back to the second clock state, the word line signals 106 are pulled down to the inactive state.

The eighth signal in FIG. 4 is the internal node 208 in FIG. 2, which is inverted to generate the word line signal 106. The last signal in FIG. 4 is the word line signal 106 on the word line 108. One of the word line signals 106 in the memory array circuit 100, corresponding to the address identified by the address signal 118, is activated. The word line signal 106 does not change in response to fluctuations in the address signal 118 on the address bus 120 because those fluctuations do not propagate through the word line latches 104.

FIGS. 5A and 5B are a flow chart illustrating a method 500 in the memory array circuit 100 in FIG. 1 for capturing address decode signals 128 in response to a clock pulse to reduce errors due to fluctuations of the address signal 118 on the address bus 120. The method 500 is a method in a memory array circuit 100 including a plurality of memory rows 110 each comprising memory bit cell circuits 112 coupled to a word line 108. The method 500 begins at FIG. 5A and includes receiving a latch clock signal $CLK_{LAT}$ in one of a first clock state and a second clock state (block 502). The method includes generating an inverted delay clock signal $CLK_{DLY}$ comprising the first clock state in response to the latch clock signal $CLK_{LAT}$ comprising the second clock state (block 504) and generating the inverted delay clock signal $CLK_{DLY}$ comprising the second clock state in response to the latch clock signal $CLK_{LAT}$ comprising the first clock state (block 506). The method further includes receiving, in one of the plurality of memory rows 110, an address decode signal 128 comprising a decode state comprising one of an active state and an inactive state (block 508). The method 500 further includes, in response to the latch clock signal $CLK_{LAT}$ comprising the first clock state and the inverted delay clock signal $CLK_{DLY}$ comprising the first clock state, storing the decode state of the received address decode signal 128 and generating the stored decode state of the address decode signal 128 on the word line 108 in the one of the plurality of memory rows 110 (block 510). The method continues at FIG. 5B and further includes, in response to the latch clock signal $CLK_{LAT}$ comprising the first clock state and the delay clock signal $CLK_{DLY}$ comprising the second clock state, holding the stored decode state of the address decode signal 128 on the word line 108 in the one of the plurality of memory rows 110 (block 512). The method also includes, in response to the latch clock signal $CLK_{LAT}$ comprising the second clock state, generating the inactive state of the address decode signal 128 on the word line 108 in the one of the plurality of memory rows 110 (block 514).

FIG. 6 is a block diagram of an exemplary processor-based system 600 that includes a processor 602 (e.g., a microprocessor) that includes an instruction processing circuit 604. The processor-based system 600 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 600 includes the processor 602. The processor 602 represents one or more general-purpose processing circuits, such as a microprocessor, central processing unit, or the like. More particularly, the processor 602 may be an EDGE instruction set microprocessor, or other processor implementing an instruction set that supports explicit consumer naming for communicating produced values resulting from execution of producer instructions. The processor 602 is configured to execute processing logic in instructions for performing the operations and steps discussed herein. In this example, the processor 602 includes an instruction cache 606 for temporary, fast access memory storage of instructions accessible by the instruction processing circuit 604. Fetched or prefetched instructions from a memory, such as from a main memory 608 over a system bus 610, are stored in the instruction cache 606. Data may be stored in a cache memory 612 coupled to the system bus 610 for low-latency access by the processor 602. The instruction processing circuit 604 is configured to process instructions fetched into the instruction cache 606 and process the instructions for execution.

The processor 602 and the main memory 608 are coupled to the system bus 610 and can intercouple peripheral devices included in the processor-based system 600. As is well known, the processor 602 communicates with these other devices by exchanging address, control, and data information over the system bus 610. For example, the processor 602 can communicate bus transaction requests to a memory controller 614 in the main memory 608 as an example of a slave device. Although not illustrated in FIG. 6, multiple system buses 610 could be provided, wherein each system bus constitutes a different fabric. In this example, the memory controller 614 is configured to provide memory access requests to a memory array 616 in the main memory 608. The memory array 616 is comprised of an array of storage bit cells for storing data. The main memory 608 may be a read-only memory (ROM), flash memory, dynamic random-access memory (DRAM), such as synchronous DRAM (SDRAM), etc., and a static memory (e.g., flash memory, static random-access memory (SRAM), etc.), as non-limiting examples.

Other devices can be connected to the system bus 610. As illustrated in FIG. 6, these devices can include the main memory 608, one or more input device(s) 618, one or more output device(s) 620, a modem 622, and one or more display controllers 624, as examples. The input device(s) 618 can include any type of input device, including but not limited to input keys, switches, voice processors, etc. The output device(s) 620 can include any type of output device, including but not limited to audio, video, other visual indicators, etc. The modem 622 can be any device configured to allow exchange of data to and from a network 626. The network 626 can be any type of network, including but not limited to a wired or wireless network, a private or public network, a local area network (LAN), a wireless local area network (WLAN), a wide area network (WAN), a BLUETOOTH™ network, and the Internet. The modem 622 can be configured to support any type of communications protocol desired. The processor 602 may also be configured to access the display controller(s) 624 over the system bus 610 to control information sent to one or more displays 628. The display(s) 628 can include any type of display, including but not limited to a cathode ray tube (CRT), a liquid crystal display (LCD), a plasma display, etc.

The processor-based system 600 in FIG. 6 may include a set of instructions 630 to be executed by the processor 602 for any application desired according to the instructions. The instructions 630 may be stored in the main memory 608, processor 602, and/or instruction cache 606 as examples of a non-transitory computer-readable medium 632. The instructions 630 may also reside, completely or at least partially, within the main memory 608 and/or within the processor 602 during their execution. The instructions 630 may further be transmitted or received over the network 626 via the modem 622, such that the network 626 includes computer-readable medium 632.

While the computer-readable medium 632 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The processor 602 in the processor-based system 600 may include, in any of the devices therein, a memory array circuit that employs an inverted delay clock circuit and word line latches for generating more stable word line signals on the word lines in the memory rows, as illustrated in FIGS. 1 and 2.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A memory array circuit comprising:
a plurality of memory rows, each comprising:
a plurality of memory bit cell circuits; and
a word line coupled to each of the plurality of memory bit cell circuits;
an inverted delay clock circuit configured to:
receive a latch clock signal comprising one of a first clock state and a second clock state;
generate an inverted delay clock signal comprising the second clock state in response to receiving the latch clock signal comprising the first clock state; and
generate the inverted delay clock signal comprising the first clock state in response to receiving the latch clock signal comprising the second clock state; and
a plurality of word line latch circuits each coupled to the word line of one of the plurality of memory rows and configured to:
receive the latch clock signal and the inverted delay clock signal;
receive an address decode signal comprising a decode state comprising one of an active state and an inactive state;
in response to the latch clock signal comprising the first clock state and the inverted delay clock signal comprising the first clock state, store the decode state of the received address decode signal and generate a word line signal comprising the stored decode state of the address decode signal on the word line in the one of the plurality of memory rows;
hold the word line signal in the stored decode state of the address decode signal on the word line in the one of the plurality of memory rows in response to the latch clock signal comprising the first clock state and the inverted delay clock signal comprising the second clock state; and
generate the word line signal comprising the inactive state of the address decode signal on the word line in the one of the plurality of memory rows in response to the latch clock signal comprising the second clock state.

2. The memory array circuit of claim 1, wherein the inverted delay clock circuit is further configured to:
generate the inverted delay clock signal in response to expiration of a delay period after receiving the latch clock signal.

3. The memory array circuit of claim 2, wherein the inverted delay clock circuit comprises:
a delay circuit configured to receive the latch clock signal; and
an inverter circuit comprising an input coupled to the delay circuit;
wherein the inverted delay clock signal is generated on an output of the inverter circuit.

4. The memory array circuit of claim 1, wherein each of the word line latch circuits comprises:
a pull-up circuit coupled to an internal node;
a pull-down circuit coupled to the internal node; and
an inverter circuit coupled from the internal node to the word line.

5. The memory array circuit of claim 4, wherein the pull-up circuit comprises:
a first transistor circuit configured to pull up the internal node to a first supply voltage corresponding to the active state in response to the latch clock signal comprising the second clock state; and
a second transistor circuit configured to, in response to the word line signal comprising the inactive state:
hold the internal node at the first supply voltage in response to the address decode signal comprising the inactive state; and
pull up the internal node to the first supply voltage in response to the inverted delay clock signal comprising the second clock state.

6. The memory array circuit of claim 5, wherein the first transistor circuit comprises a pull-up transistor comprising:
- a first terminal coupled to a first supply voltage node;
- a second terminal coupled to the internal node; and
- a gate terminal configured to control coupling the first supply voltage node to the internal node in response to the latch clock signal comprising the second clock state.

7. The memory array circuit of claim 5, wherein the second transistor circuit comprises:
- a second transistor comprising:
  - a first terminal coupled to a pull-up node;
  - a second terminal coupled to the internal node; and
  - a gate terminal configured to control coupling the pull-up node to the internal node in response to the address decode signal comprising the inactive state;
- a third transistor comprising:
  - a first terminal coupled to a first supply voltage node;
  - a second terminal coupled to the pull-up node; and
  - a gate terminal configured to control coupling the first supply voltage node to the pull-up node in response to the word line signal comprising the inactive state; and
- a fourth transistor comprising:
  - a first terminal coupled to the pull-up node;
  - a second terminal coupled to the internal node; and
  - a gate terminal configured to control coupling the pull-up node to the internal node in response to the inverted delay clock signal comprising the second clock state.

8. The memory array circuit of claim 4, wherein the pull-down circuit is further configured to, in response to the latch clock signal comprising the first clock state:
- hold the internal node at a second supply voltage corresponding to the inactive state in response to the word line comprising the active state; and
- pull down the internal node to the second supply voltage in response to the address decode signal comprising the active state and the inverted delay clock signal comprising the first clock state.

9. The memory array circuit of claim 8, the pull-down circuit comprising:
- a fifth transistor comprising:
  - a first terminal coupled to the internal node;
  - a second terminal coupled to a pull-down node; and
  - a gate terminal configured to control coupling the internal node to the pull-down node in response to the latch clock signal comprising the first clock state;
- a sixth transistor comprising:
  - a first terminal coupled to the pull-down node;
  - a second terminal; and
  - a gate terminal configured to control coupling the pull-down node to the second terminal of the sixth transistor in response to the address decode signal comprising the active state;
- a seventh transistor comprising:
  - a first terminal coupled to the second terminal of the sixth transistor;
  - a second terminal coupled to a second supply voltage node; and
  - a gate terminal configured to control coupling the second terminal of the sixth transistor to the second supply voltage node in response to the inverted delay clock signal comprising the first clock state; and
- an eighth transistor comprising:
  - a first terminal coupled to the pull-down node;
  - a second terminal coupled to the second supply voltage node; and
  - a gate terminal configured to control coupling the pull-down node to the second supply voltage node in response to the word line comprising the active state.

10. The memory array circuit of claim 1, further comprising a decoding circuit comprising:
- an input coupled to a first address bus; and
- a plurality of outputs each coupled to one of the plurality of word line latch circuits;
- wherein the decoding circuit is further configured to:
  - receive a first address signal on the first address bus;
  - decode the first address signal;
  - generate, on one output of the plurality of outputs corresponding to the decoded first address signal, the address decode signal comprising an active state; and
  - generate, on outputs of the plurality of outputs not corresponding to the decoded first address signal, the address decode signal comprising the inactive state.

11. The memory array circuit of claim 10, further comprising an address capture circuit coupled to the first address bus and to a second address bus, the address capture circuit further configured to:
- receive a second address signal on the second address bus;
- receive a system clock signal comprising one of a system clock active state and a system clock inactive state;
- in response to the system clock signal comprising the system clock active state: store the second address signal; and
  - hold, on the first address bus, the first address signal based on the second address signal stored in the address capture circuit; and
- in response to the system clock signal comprising the system clock inactive state, generate, on the first address bus, the first address signal based on the second address signal received on the second address bus.

12. The memory array circuit of claim 7, wherein the first, second, third, and fourth transistors comprise P-type metal-oxide semiconductor (PMOS) transistors.

13. The memory array circuit of claim 9, wherein the fifth, sixth, seventh, and eighth transistors comprise N-type metal-oxide semiconductor (NMOS) transistors.

14. An integrated circuit (IC) comprising a memory array circuit, the memory array circuit comprising:
- a plurality of memory rows, each comprising:
  - a plurality of memory bit cell circuits; and
  - a word line coupled to each of the plurality of memory bit cell circuits;
- an inverted delay clock circuit configured to:
  - receive a latch clock signal comprising one of a second clock state and a first clock state;
  - generate an inverted delay clock signal comprising the first clock state in response to the latch clock signal comprising the second clock state; and
  - generate the inverted delay clock signal comprising the second clock state in response to the latch clock signal comprising the first clock state; and
- a plurality of word line latch circuits each coupled to the word line of one of the plurality of memory rows and configured to:
  - receive the latch clock signal;
  - receive the inverted delay clock signal;
  - receive an address decode signal comprising a decode state comprising one of an active state and an inactive state;

in response to the latch clock signal comprising the first clock state and the inverted delay clock signal comprising the first clock state, store the decode state of the received address decode signal and generate a word line signal comprising the stored decode state of the address decode signal on the word line in the one of the plurality of memory rows;

in response to the latch clock signal comprising the first clock state and the inverted delay clock signal comprising the second clock state, hold the word line signal in the stored decode state of the address decode signal on the word line in the one of the plurality of memory rows; and in response to the latch clock signal comprising the second clock state, generate the word line signal comprising the inactive state of the address decode signal on the word line in the one of the plurality of memory rows.

15. The IC of claim 14, wherein the inverted delay clock circuit comprises an inverting delay circuit configured to generate the inverted delay clock signal in response to expiration of a delay period after receiving the latch clock signal.

16. The IC of claim 15, wherein each of the word line latch circuits comprises:
a pull-up circuit coupled to an internal node;
a pull-down circuit coupled to the internal node; and
an inverter circuit comprising:
an input terminal coupled to the internal node; and
an output terminal coupled to the word line.

17. The IC of claim 16, wherein the pull-up circuit comprises:
a first transistor circuit configured to pull up the internal node to a first supply voltage corresponding to the active state in response to the latch clock signal comprising the second clock state; and
a second transistor circuit configured to, in response to the word line comprising the inactive state:
in response to the address decode signal comprising the inactive state, pull up the internal node to the first supply voltage; and
in response to the inverted delay clock signal comprising the second clock state, pull up the internal node to the first supply voltage.

18. The IC of claim 17, wherein the pull-down circuit is configured to, in response to the latch clock signal comprising the first clock state, pull down the internal node to a second supply voltage corresponding to the inactive state in response to:
the word line comprising the active state; and
the address decode signal comprising the active state and the inverted delay clock signal comprising the first clock state.

19. The IC of claim 15, further comprising a decoding circuit comprising:
an input coupled to a first address bus;
a plurality of outputs each coupled to one of the plurality of word line latch circuits;
wherein the decoding circuit is further configured to:
receive a first address signal on the first address bus;
decode the first address signal;
generate, on an output of the plurality of outputs corresponding to the decoded first address signal, the address decode signal comprising the active state; and
generate, on outputs of the plurality of outputs not corresponding to the decoded first address signal, the address decode signal comprising the inactive state; and an address capture circuit coupled to the first address bus and to a second address bus;
wherein the address capture circuit is further configured to:
receive a second address signal on the second address bus;
receive a system clock signal comprising one of a system clock active state and a system clock inactive state;
in response to the system clock signal comprising the system clock active state:
store the second address signal; and
hold, on the first address bus, the first address signal based on the second address signal stored in the address capture circuit; and
in response to the system clock signal comprising the system clock inactive state, generate, on the first address bus, the first address signal based on the second address signal received on the second address bus.

20. A method in a memory array circuit comprising a plurality of memory rows each comprising memory bit cell circuits coupled to a word line, the method comprising:
receiving a latch clock signal comprising one of a first clock state and a second clock state;
generating an inverted delay clock signal comprising the first clock state in response to the latch clock signal comprising the second clock state;
generating the inverted delay clock signal comprising the second clock state in response to the latch clock signal comprising the first clock state;
receiving, in one of the plurality of memory rows, an address decode signal comprising a decode state comprising one of an active state and an inactive state;
in response to the latch clock signal comprising the first clock state and the inverted delay clock signal comprising the first clock state, storing the decode state of the received address decode signal and generating the stored decode state of the address decode signal on the word line in the one of the plurality of memory rows;
in response to the latch clock signal comprising the first clock state and the inverted delay clock signal comprising the second clock state, generating the stored decode state of the address decode signal on the word line in the one of the plurality of memory rows; and
in response to the latch clock signal comprising the second clock state, generating the inactive state of the address decode signal on the word line in the one of the plurality of memory rows.

* * * * *